United States Patent [19]

Sherman

[11] Patent Number: 4,671,446
[45] Date of Patent: Jun. 9, 1987

[54] METHOD AND SYSTEM FOR AUTOMATICALLY BONDING A LEADWIRE ON A SEMICONDUCTOR

[75] Inventor: Rand C. Sherman, Holmdell, N.J.

[73] Assignee: Stanley Electric Company, Ltd., Yokahama, Japan

[21] Appl. No.: 817,086

[22] Filed: Dec. 27, 1985

Related U.S. Application Data

[63] Continuation of Ser. No. 446,221, Dec. 2, 1982, abandoned.

[51] Int. Cl.⁴ .................. B23K 37/04; H01L 21/60
[52] U.S. Cl. .................................. 228/4.5; 228/105; 228/179; 250/225
[58] Field of Search ............. 250/225; 228/105, 179, 228/4.5

[56] References Cited

U.S. PATENT DOCUMENTS

| | | | |
|---|---|---|---|
| 2,947,212 | 8/1972 | Woods | 250/225 |
| 3,499,159 | 3/1970 | Carrier et al. | 250/225 |
| 3,567,309 | 3/1971 | Jasgur | 350/399 |
| 3,699,350 | 10/1972 | Holdaway | 250/225 |
| 3,785,507 | 1/1974 | Wiesler | 228/105 |
| 4,203,132 | 5/1980 | Schmitt | 228/102 |
| 4,347,964 | 9/1982 | Takasugi | 228/4.5 |
| 4,469,442 | 9/1984 | Reich | 250/225 |

FOREIGN PATENT DOCUMENTS

| | | | |
|---|---|---|---|
| 59731 | 5/1980 | Japan | 228/105 |
| 84535 | 7/1981 | Japan | 250/225 |
| 147143 | 11/1981 | Japan | 228/102 |

Primary Examiner—Kenneth J. Ramsey
Attorney, Agent, or Firm—Robert B. Watkins

[57] ABSTRACT

The bonding of a lead wire on a semiconductor having an ohmic contact metal electrode provided locally on a surface at a selected location is achieved through detecting the image of the metal electrode more precisely by enhancing the contrast between the metal electrode and the semiconductor surface. The enhanced contrast is accomplished by illuminating the contact-carrying surface at Brewster's angle with a beam of light rays having a wavelength in the range of the light transmission coefficient of the semiconductor material constituting the chip, and polarizing either the illuminating beam or the reflected beam or both to produce a difference in intensity of light between the contact and the light reflected from the semiconductor area. The illuminating light beam may be passed through a filter means to render a narrow frequency beam of light rays. The enhanced contrast reflecting beam is detected and converted to an electronic signal which is digitized and connected to servomechanisms that move the lead wire into bonding contact with the metal electrode.

8 Claims, 14 Drawing Figures

METHOD AND SYSTEM FOR AUTOMATICALLY BONDING A LEADWIRE ON A SEMICONDUCTOR

This application is a continuation of copending U.S. patent application Ser. No. 446,221 filed Dec. 2, 1982, now abandoned, by the same inventor Rand C. Sherman.

FIELD OF THE INVENTION

The present invention relates to improvements in systems and methods of bonding a lead wire to a metal electrode on a semiconductor chip, the chip being made of a semiconductor material selected from Group III–V compound semiconductor materials such as Gap or Group IV semiconductor material such as Si and Group II–VI compound semiconductor material such as CdS, which is capable of transmitting infrared or visible light rays. In addition, it pertains to a method and a system for detecting the image and location of the metal electrode provided ohmicly on a surface of a semiconductor chip.

BACKGROUND OF THE INVENTION

The process of fabricating a semiconductor device into a final electric component includes the step of fixedly mounting a semiconductor chip having, for example, a pn junction formed therein and having a certain function, onto a support which is called a "stem" made of either an electroconductive metal or a non-conductive or insulating ceramic; and to bond a lead wire to a metal electrode ohmicly provided at a predetermined location on the surface of the chip, for a subsequent electric connection between the metal electrode and terminals of an external electric or electronic equipment.

Such fabricating step, especially in mass production, requires that it be completed with precision and during a short period of time. To this end, there arises the necessity for a quick and precise location of the metal electrode, i.e., the position thereof at which a lead wire is to be bonded. The metal electrode is in ohmic contact with a surface of the semiconductor chip which is fixedly mounted on a support or "stem"; and there is the necessity for driving a bonding apparatus such as a "wire bonder" in conjunction with the detection of the image and location of the ohmic contact metal electrode.

Typical conventional wirebonding apparatus includes a means for holding a lead wire and means for maneuvering the lead wire by orthogonal movement of the holding means. Servomechanisms are provided which move the holding means and the wire in each of three dimensional directions according to electrical signals conveyed to the servomechanisms. In conventional practice, the bonding apparatus may be controlled by manual manipulations from an operator viewing the end of the connecting wire through a microscope or otherwise.

More recent bonding apparatus that is controlled by sensors and optical images and video signals has been hindered by the quality of the images and particularly when the bond is to be made at a surface which is transparent.

With respect to this locating and bonding operation, various techniques have been developed so far, depending on the purpose of use or the type of the device which employes the semiconductor chip.

In case of a semiconductor device comprised of a Group III–V compound semiconductor material such as GaP, and especially in the case where the semiconductor material is transparent to infrared or visible rays, as in case of a GaP LED (light-emitting diode) which features a small absorption by the semiconductor material of those light rays in the region of wavelengths of visible light and infrared rays, it has bee the usual practice in a mass production system to illuminate the surface of the semiconductor chip for the purpose of locating that particular metal electrode on the surface of the chip to which a lead wire is to be bonded.

Description of the detecting and bonding process will be made hereunder in further detail with respect to the instance of a GaP LED, as an example of a semiconductor chip.

A GaP LED is a semiconductor device which has a pn junction formed therein. It is operative so that by the application of a forward bias across an ohmic metal electrode contact formed on a p type semiconductor region and a metal electrode provided ohmmicly on an n type semiconductor region, to thereby cause a forward current to flow across the pn junction to emit light therethrough. A basic structure of a simplest ordinary GaP LED model is schematically illustrated in FIG. 1, which is a vertical sectional view.

Figure 1:
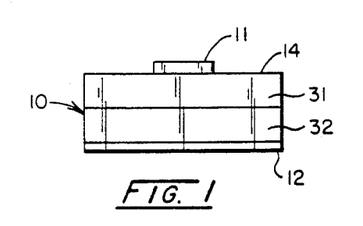
FIG. 1 is a schematic elevational sectional view of a typical GaP LED for the purpose of explaining the basic structure thereof.

In FIG. 1, a GaP semiconductor chip 10 is basically divided into two adjacent semiconductor regions; i.e., a p type region 31 and a n type region 32. It should be understood that the conductivity types of these two regions 31 and 32 may be reversed. Two metal electrodes 11 and 12 are provided ohmicly on these two regions 31 and 32, respectively. The top surface of the semiconductor chip 10 has a light-emitting area 14. The bottom surface of the chip 10 is ohmicly provided with a metal electrode 12 fixedly mounted on a support (not shown) via, for example, an electroconductive paint containing silver or via a fusible metal solder which melts at a low temperature.

After fixedly mounting the chip 10 onto a support, a lead wire is bonded to the metal electrode 11, which is ohmicly provided on top of the chip 10, by relying on the technique of thermal compression bonding or ultrasonic thermal compression bonding. In order to facilitate the locating operation for the metal electrode on the surface of the chip 10, this surface is illuminated.

The operation of locating a metal electrode by means of illumination has been conducted usually by relying on the below mentioned techniques. These conventional techniques will be briefly described by referring to FIGS. 2 which are schematic perspective views of an apparatus arrangement.

Figure 2A:
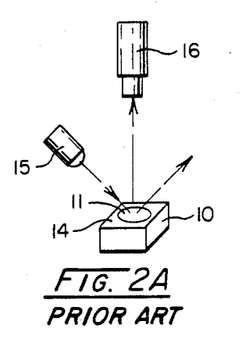
FIGS. 2(a) through (e) are schematic perspective views of various conventional prior art illumination techniques for the detection of the image and location of a metal electrode ohmicly provided on the top surface of a semiconductor chip.
Figure 2B:
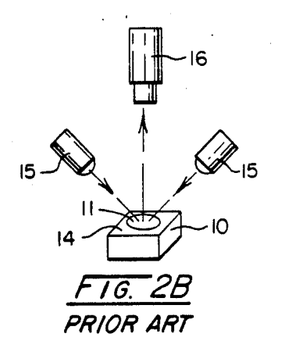

FIGS. 2(a) and (b) illustrate the technique using an oblique illumination. A beam of light from a light source 15 is caused to impinge obliquely onto a top surface 14 of the semiconductor chip 10 that is ohmicly contacted locally by a metal electrode 11 and which serves as the light-emitting area surface 14, excepting the ohmic-contact area.

In cases of FIGS. 2(a) and (b), the beam of reflecting light rays, which is incident to a detector 16, such as an image sensor, represents a portion of those light rays reflected in scattering fashion from a rough surface of the chip. In these two cases specular light rays, which are reflected on the smooth flat surface, are eliminated.

Figure 2C:
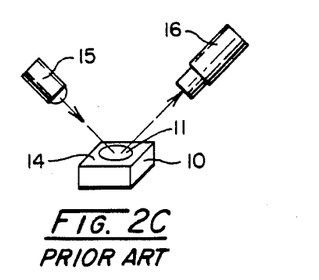

FIG. 2(c) shows an instance wherein the top surface 14 of the chip 10 is illuminated by an oblique beam of light rays emitted from a light source 15, and the specularly reflected light beam off the smooth flat surface enters into the detector 16. In this instance, the light rays scattered by the rough surface portions are eliminated so that this technique may be termed the specular illuminated technique.

Figure 2D:
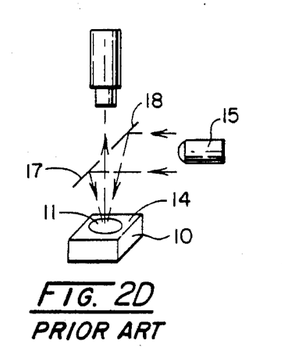

FIG. 2(d) illustrates a modification of the oblique illumination techniques of FIGS. 2(a) and (b). A beam of light rays emitting from a light source 15 is specularly reflected by mirrors 17 and 18 to illuminate the surface of the semiconductor chip.

Figure 2E:
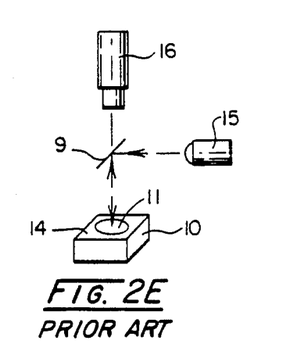

FIG. 2(e) is a modification of the specular illumination technique. A beam of light rays emitting from a light source 5 is specularly reflected by a light beam splitter 19, such as a half-mirror, and this reflected beam of light is used to illuminate the smooth and flat surface of a semiconductor chip 10. And, the beam of light which is specularly reflected off this surface passes through a light beam splitter 19 to impinge onto the detector 16.

It should be understood here that, in order to detect the position of the metal electrode region in good contrast to the light-emitting region of the semiconductor chip surface, it is a requirement that the images of these two regions be detected jointly by the detector. However, as stated earlier herein, semiconductor material, such as GaP, which may constitute a semiconductor chips, is by nature transparent to visible and infrared rays. Therefore, in any kind of conventional illumination techniques, the beam of light rays reflected off a GaP semiconductor chip surface and impinging onto the detector, consists of a component of light rays reflected from the top surface of the semiconductor chip, and a component of light rays which pass from the light-emitting area through the semiconductor material and are reflected at the metal electrode 12 or other metal layer provided at the bottom surface of this chip and emit again through the top surface of the chip.

As such, the metal electrode 11 which is ohmicly provided on top of the semiconductor chip, and the metal electrode 12 provided at the bottom thereof will be detected by the detector in substantially the same position or appearance. Thus, the detector is unable to sufficiently distinguish the metal electrode region 11 provided ohmicly on the top surface of the semiconductor chip from the region of the light-emitting area of the chip surface.

For the reason stated above, the conventional illumination techniques have the inconveniences and drawbacks such that a precise detection of the location of the metal electrode ohmicly provided on top of a semiconductor chip requires a lengthy time, and/or that the circuit arrangement for analyzing the image detected, even by a highly sophisticated detector, becomes complicated. Also the operation of the leadwire bonder, which operates in conjunction with the detector, becomes erroneous.

It is, therefore an object of the present invention to provide a wire bonder with an improvement in the illumination method which eliminates such inconvenience and drawbacks of the conventional illumination techniques as stated above.

Another object of the present invention is to provide a wire bonder with an illumination method of a type, which enhances the contrast between the image of light rays reflected from the surface of a semiconductor material and the image of light rays reflected from a metal electrode provided on the top surface of said semiconductor material by drastically varying the intensities of these two kinds of light rays.

Still another object of the present invention is to provide an illumination method and system of the type as described above, which allows the detection of the image as well as the location of the metal electrode provided ohmicly on the top surface of a semiconductor chip to be carried out by a relatively simplified optical or analyzing system, and to thereby quicken the precise bonding operation of the leadwire bonder in conjunction with the detector.

A yet further object of the present invention is to provide an illumination method and system of a type similar to that described above, which performs the detection of the image and position of the metal electrode in good contrast to the image and location of the semiconductor material regions of the chip by causing when, a beam of light illuminates the chip surface, a maximum polarization of light transmitted through the semiconductor material regions. This is done by casting the illuminating beam of light at Brewster's angle as defined between the axis of the beam of light and a line normal to the chip surface, and also by producing a maximum difference in value between the intensity of the light reflected off the metal electrode and the intensity of the light reflected off the semiconductor material by using a polarizer.

Although it is known that contrast can be enhanced between a mark on the surface of a relative transparent material by means of projecting and reflecting light at Brewster's angle as shown by U.S. Pat. No. 3,699,350 Holdaway, this advantage has not been previously conceived or taught in connection with a wirebonding operation and apparatus. The problem of obtaining a contrasting image with a physical object on the surface of a transparent material is involved. The reference patent teaches reflecting a beam of light on the surface of a polyster, glass, or other material having an index of refraction for the wavelength of radiant energy being used, and reflecting the light at an angle of incidence equal to Brewster's angle. The back of the substrate is coated with a light absorbent material such as iron oxide or flat back paint. By this means a mark or indicia is made to contrast and provide an electric signal on a photo detector. There is no teaching or understanding in the patent that a contrasting image of a physical object on the surface of a transparent substrate can be precisely contrasted on the surface of a semiconductor chip. The patent teaches that a gross indication can be achieved of the presence of a mark on the surface of the transparent substrate, if the function of preventing light from being internally reflected in the substrate and back to the photo pickup can be accomplished by several expedients, such as making the back surface of this substrate irregular or a darker absorbent color. The light absorbing layer on the opposite side of the substrate from the incidental light beam is taught to be very important in the patent.

U.S. Pat. No. 3,567,309 Jasgur teaches the glare can be reduced on the background of an object being viewed if the incidental light is polarized and a polarizing means is provided in the reflected light beam at a different angle of polarization with respect to the direction of the incident light.

It is an object of this invention to combine these prior art teachings in a new system for the automatic bonding of lead wires on a semiconductor chip by a bonding machine.

SUMMARY OF THE DISCLOSURE

In summary, this invention is a system for bonding a lead wire on a metal electrode which is provided on the surface of an essentially transparent semiconductor material chip that is fixedly mounted on a support means. The system operates by precisely locating and imaging the metal electrode relative to the surface of the chip and comprises: (a) a wirebonding means that is constructed to hold and maneuver a lead wire into bonding contact with the metal electrode by a servomechanism that is capable of translating the lead wire in orthogonal directions; (b) a light source means is provided externally to the semiconductor chip for illuminating a surface of the chip by means of a beam of light rays cast upon the surface of the chip at an oblique angle corresponding substantially to Brewster's angle with respect to the refractive index of the semiconductor material, relative to a line normal to the surface of a semiconductor chip; (c) detecting means operatively coupled to the wirebonding means and positioned to sense the beam of light rays reflected from the metal electrode and from the surface of the semiconductor chip as the surface is illuminated by the light means and to transmit a digitized electronic signal to the wirebonding means and the servomechanisms thereof; and (d) polarizing means provided externally to the semiconductor chip for further polarizing the beam of light rays before it arrives at the detecting means, with the axis of polarization of the polarizing means being adjustable to provide maximum image resolution and identification of the position of the metal electrode, and the polarization also being adjustable to provide sufficient resolution to clearly identify the site of location, the size, and the shape of the metal electrode, so that the detecting means detects the image and generates the digitized electronic input signal to operate and manipulate the position of the leadwire in the wirebonding means into bonding contact with the metal electrode.

In further summary, the invention includes a method of detecting an image and location of an ohmic contact metal electrode which has been provided locally on a semiconductor chip surface, comprising: illuminating the surface of the chip with a beam of light rays emitting from a light source means at an oblique angle corresponding substantially to Brewster's angle relative to a line normal to the surface, to thereby cause linearly maximally polarized light rays to be transmitted especially at semiconductor areas of the chip surface among all of the other light rays reflected through the semiconductor chip, the beam of light rays having a wave length of a range corresponding to the maximum light transmitting coefficient of the semiconductor chip; and causing a maximum difference in intensity of light rays between the beam reflected from the ohmic contact metal electrode area and the light rays reflected at the adjacent semiconductor areas by passing the beam of light rays through polarizing means before the beam of light rays reaches a light detector.

The foregoing and other advantages of the invention will become apparent from the following disclosure in which a preferred embodiment of the invention is described in detail and illustrated in the accompanying drawings. It is contemplated that variations in structural features and arrangement of parts may appear to the person skilled in the art, without departing from the scope or sacrificing any of the advantages of the inventor.

BRIEF DESCRIPTION OF THE DRAWINGS

FIGS. 5 (a) through (b) are schematic elevational views for showing the direction of the reflected light which varies with the difference in the surface curvature of the support.

BEST MODE FOR CARRYING OUT THE INVENTION

The system, according to the present invention, for bonding a lead wire on an electrode on a semiconductor chip includes the improvement of applying the principle which is generally known as Brewster's Law.

As is well known, Brewster's Law may be summarized that, in the case an electromagnetic wave (which is a travelling wave such as a light ray wave or radiowave) transmits through a first medium I and reaches, as an incident beam, the boundary between the first medium and a next medium II, there is a degree of polarization that occurs in the light rays reflected from the boundary and in the light rays which are transmitted therethrough. In case the incident angle assumes an angle $_B$ which satisfies the condition $\tan {}_B = n_2/n_1$ (wherein $n_2$ and $n_1$ are the refractive indices of index II and I, respectively), the degree of polarization becomes maximum, and the reflected light rays will become an electromagnetic wave of a perfectly linear polarization. Since the light is incident at this angle, the electric vector of the reflected light has no component in the plane of incidence. This angle $_B$ is called Brewster's angle.

The system of the present invention adroitly utilizes the above-stated optical characteristics of light rays in bonding a lead wire on a metal electrode by an automatic wirebonding module machine.

Figure 3A:
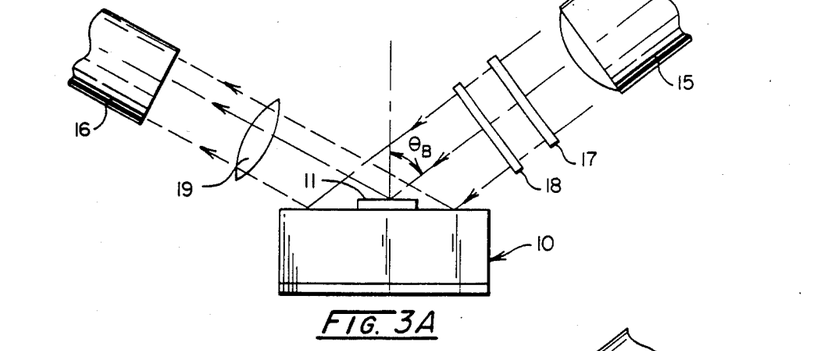
FIGS. 3(a) through (c) are schematic elevational views of some basic arrangements of the system according to the present invention.
Figure 3B:
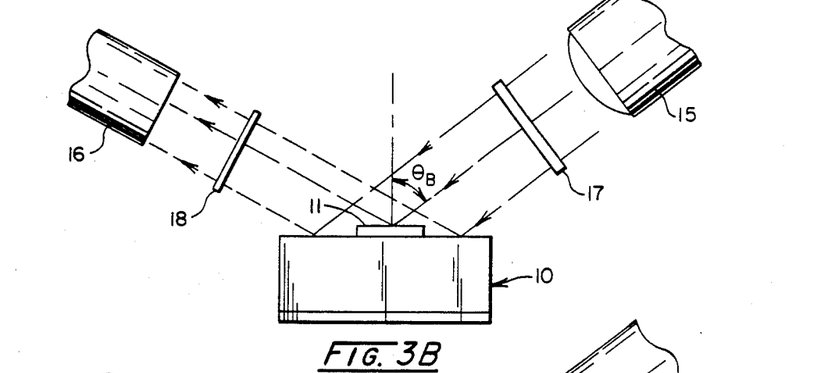
Figure 3C:
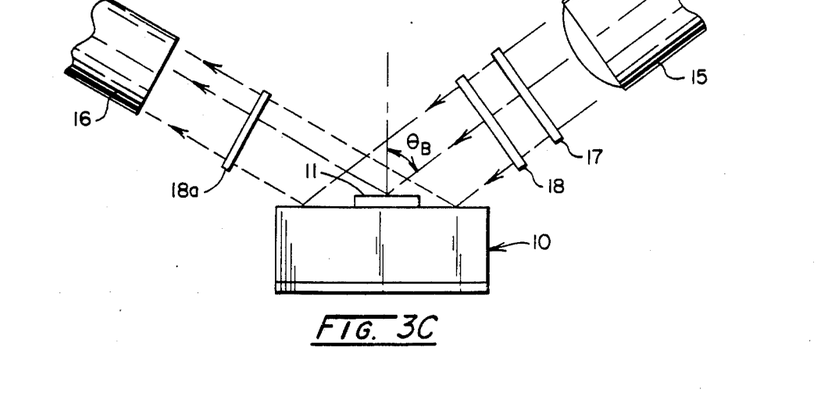

A basic arrangement of the system employing the illumination method according to the present invention is shown in FIGS. 3(a) through (c).

In each of FIGS. 3(a) and (b), the beam of light from a light source 15 illuminates the semiconductor chip 10 as light rays parallel to the axis of incidence and in a direction oblique to the semiconductor chip. The beam of light is caused to impinge onto the semiconductor chip 10 at an oblique incidence angle which is substantially equal to Brewster's angle obtained from the refraction index n that the semiconductor material possesses; i.e., at an incident angle $\beta$ which satisfies the condition $\tan \beta = n$.

A filter 17, which is disposed within the path of the incident light rays at a position closer to the light source, is intended to convert the light beam emitting from the light source 15 to a narrow frequency light beam; i.e., to make the frequencies of the light beam similar. This filter plays an important role in that its inclusion leads to a more effective exhibition of the advantages of the present invention. Nevertheless, this filter may be omitted in some situations, and if contrast is sufficient without.

The member 18, which is disposed in the path of the incident light, is a polarizer such as a polarizing plate, and causes a polarization of the light beam. This polarizer 18 is an essential component of the present invention. Depending on cases, it may be necessary to provide a lens 19 in the path of the reflected light or within the detector 16 to focus the image of the semiconductor chip exactly on the plane of the image sensor contained in the detector. FIG. 3(a) shows the embodiment wherein a polarizer 18 is provided in the path of the incident light. FIG. 3(b) shows the instance wherein a polarizer 18 is provided in the path of the reflected light. FIG. 3(c) shows the instance wherein a polarizer 18 is disposed in each of the paths of the incident light and the reflected light. By giving reference to FIGS. 3(a) through (c), a further detailed description of the illumination system of the present invention in the case where GaP is used as the material of the semiconductor chip follows.

In the case of the arrangement of FIG. 3(a), it should be understood that GaP has a very high transparency for red lights. Therefore, it will be convenient in the present invention if the light rays emitting from the light source 15 are red or are light rays having a wavelength in a region exhibiting a red color. This incident light beam is caused to impinge onto the semiconductor chip 10 at an incident angle substantially corresponding to Brewster's angle (Brewster's angle in the red color region of GaP is about 73°). In doing so, the plane of the incident light beam is set to a certain plane by passing the beam through the polarizer 18. Here, the certain plane means that the beam of incident light is polarized in such manner that the electric vector of the incident light beam exists only in the plane of incident, so that the polarized plane of the incident light beam is parallel with the plane of incidence.

By rendering the incident light beam to such a polarized light beam as stated above, this beam of light will cause the reflection at the surface of the metal electrode to become a reflected light, whereas the beam of light incident to the surface of the GaP semiconductor chip not containing the ohmic contact will entirely transmit through the semiconductor material without causing any reflection. The details of the effect of reflection of the metal layer which is provided on the bottom surface of the semiconductor chip will be stated later.

Accordingly, the image of the metal electrode which is incident to the image sensor 16 has a great intensity of light, whereas the image of the semiconductor chip (in this case, it is the image of the light-emitting area) will have a very weak intensity of light. Thus, the image and position of the metal electrode can be precisely detected because of a very good contrast to the other area.

In case of the arrangement shown in FIG. 3(b), the basic manner of illumination is the same as that shown in FIG. 3(a). However, it should be noted that the light rays reflected off the semiconductor chip, especially those light rays reflected from the surface of this semiconductor chip, are perfectly polarized rays; and these light rays are linearly polarized light rays in the polarization plane wherein the electric vector of the reflected light rays has no component parallel with the plane of the incident light. Therefore, by placing such a polarizer 18 in the path of the reflected light as will polarize the light rays in a direction normal to the plane of polarization, there can be accomplished a detection of the image and location of the metal electrode with an enhanced contrast identical with the result obtained from the instance of FIG. 3(a).

Even when, in the above stated instance, there are some light rays reflected off the bottom surface of the semiconductor chip after passing through this chip, such light rays will reach the surface of the semiconductor material beyond the critical angle. Thus, these light rays will reflect only within the semiconductor material, and these reflected light rays will never be detected by the detector.

The arrangement of FIG. 3(c) represents a combination of the respective features of FIGS. 3(a) and (b). It should be noted that the directions of polarization by the two polarizers 18 and 18a are normal to each other. Although the system per se in this instance has become somewhat more complicated, there is the convenience and advantage that, as compared with the instances of FIGS. 3(a) and (b), the contrast between the image of the semiconductor chip surface area and the image of the metal electrode ohmicly provided on the top surface thereof can be adjusted to be maximum. Although in the systems of FIGS. 3(a) and (b) also, adjustment of contrast can be achieved by somewhat rotating the polarizer, it should be noted that the provision of two polarizers as in the case of FIG. 3(c) leads to the convenience that adaptation can be made with more easiness to the variation of the flatness of either or both of the surfaces of the semiconductor material and the metal electrode. Therefore, even in case the incident angle departs somewhat away from Brewster's angle, an enhancement of contrast of the images between the light-emitting area of the semiconductor chip and the metal electrode area can be sufficiently achieved by an adjustment done through a rotation of a polarizer.

By the adoption of the present invention, it becomes possible to clearly identify the site of location, the size and the shape of a metal electrode provided ohmicly on the surface of a semiconductor chip, and thus it becomes possible to achieve a precise and quick bonding operation of a wire bonder which is in conjunction with and in synchronization with a detector such as an image sensor.

Figure 4:
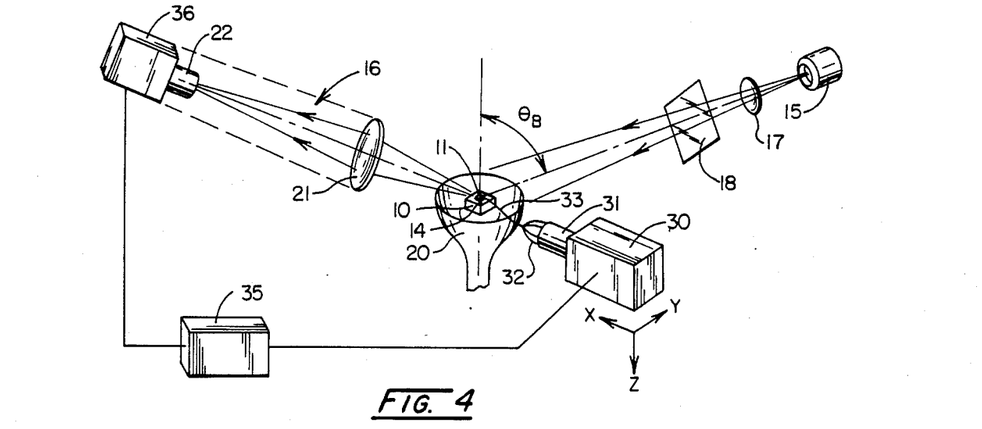
FIG. 4 is a schematic perspective view of the Brewster's angle illumination method according to the present invention in a case where a semiconductor chip carrying an ohmic contact metal electrode thereon is mounted on a support that has a parabolic reflector.

Referring to FIG. 4, schematically shown is the system to detect the image and the location of a metal electrode in the case where the illumination method according to the present invention using Brewster's angle is employed. Here, a support 20 is a parabolic reflector, which is a lead frame having a parabolic inner surface, and is often used for LEDs 10 having a metal electrode 11. A lens 21, and an image sensor 22 are provided within a detector 16. A polarizer 18 is adjacent to a light source 15.

Referring further to FIG. 4 a wirebonder 30 is mounted operatively adjacent to the support 20 and includes an armature 31 having a chuck 32 holding a leadwire 33. The wirebonder 30 is constructed with the capability for orthogonal translation in three coordinate directions of movement x, y, and z. The wirebonder 30 is electrically connected to an electronics processing unit (CPU) 35 which receives an input signal from a diode a ray camera 36. The camera 36 receives the focused image from the lens 21 that is reflected from the metal electrode 11.

In operation the camera 36 electronically transmits the image to the electronics processing unit 35 which digitizes the signal and controls the wirebonder 30 through servo motors that move the wirebonder 30 in either of othogonal directions x, y, and z to bring the lead wire 33 into contact with the metal electrode 11.

Now, some review will herein below be made as to the effect of the difference in the surface condition of the support on which a semiconductor chip is fixedly mounted, on the detection of the image and location of a metal electrode.

Figure 5A:
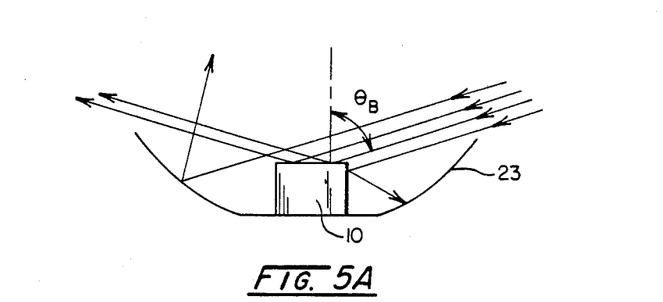

FIG. 5(a) schematically shows the direction of the incident light rays as they are reflected at the chip surface and at the reflector, in the case where support is a parabolic reflector 23. In this instance, the reflected light rays which travel toward the detector are only those light rays reflected off the top surface of the semiconductor chip 10, and other light rays are reflected elsewhere by the curved inner surface of the parabolic reflector 23. Therefore, the image of the chip surface impinges onto the detector with a distinguishing contrast.

Figure 5B:
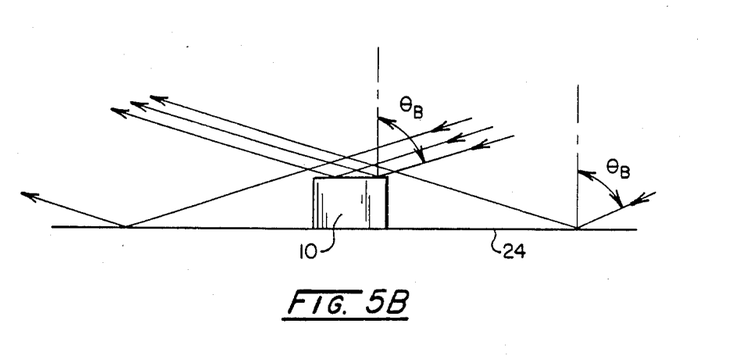

On the other hand, in case the surface of the support 24 is flat as shown in FIG. 5(b), not only those light rays reflected off the top surface 14 of the semiconductor chip, but also those light rays reflected from the flat metal surface surrounding the chip as well, will travel toward the detector. Accordingly, there will arise more or less a difference as compared with the instance shown in FIG. 5(a). Depending on the case, there could arise the possibility that the contact will become poor locally at the marginal perihery of the image of the chip in the event that the chip has such electrode structure that, different from FIG. 1, the ohmic electrode contact surrounds the light-emitting area; i.e., the structure that the ohmic electrode is present at the marginal periphery of the chip. Therefore, a detector which is of the pattern recognition type will be more suitable than the light intensity detecting type.

As an alternative method, the diameter of the incident beam of light may be reduced to a beam size corresponding substantially to the chip size, or the metal electrode that is provided on the chip may be positioned a little inside of the marginal periphery of the chip to reveal the semiconductor surface a little at the marginal periphery of the chip; or the flat surface portion of the support locating at the rear side of the semiconductor chip may be roughened by applying, for example, a sand blast, to cause the reflected light rays to scatter in various directions, or these techniques may be combined, whereby it is possible to avoid any lowering of the degree of contrast produced.

It should be noted also that the illumination system, according to the present invention, can produce an image of only the metal electrode, theoretically speaking, so that it is compatible with either a digital pattern recognition system or a light intensity detecting system.

Thus, the illumination method of the present invention, coupled with, for example, a digital pattern recognition unit, will form a desirable system.

Figure 6:
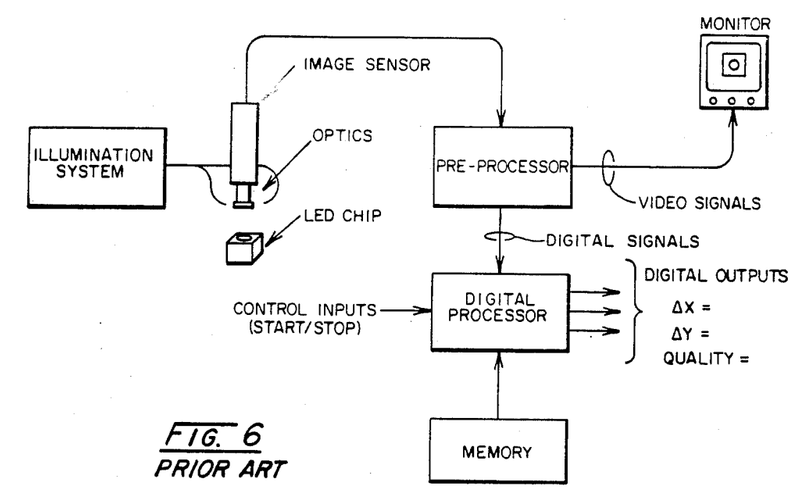
FIG. 6 is a diagrammatic representation of the prior art detecting system showing the mutual relationship of the constituent parts.

The present invention, the simple diode array camera 36 and processing electronics Unit 35 is used, as compared to the more complicated conventional prior art combination of a video camera (image sensor), a preprocessor and a digital processor, and so forth, of FIG. 6. The light intensity detection system would probably be less expensive and faster than a feature extraction type of the pattern recognition system. It is also conceivable that the light intensity detecting system could determine if the chip were inverted in the lead frame by analyzing the area of the electrode (i.e., large surface area being a cathode, and smaller surface area being an anode).

The illumination system according to the present invention, is an arrangement such that the angle of the incident light with which a semiconductor chip is illuminated is a Brewster's angle, and a polarizer is inserted at least in the path of the incident light rays or the path of the reflected light rays. Thus, the light ray signal which enters in the detector, basically, is a signal of the image of only the metal electrode.

Now, in practice, there may occur instances that the height of chips varies somewhat from one chip to another, leading to variation of the site at which the light beam for illumination impinges onto the chip surface. Such inconvenience can be overcome by, for example, the additional provision of another detecting system as will be described below.

Figure 7:
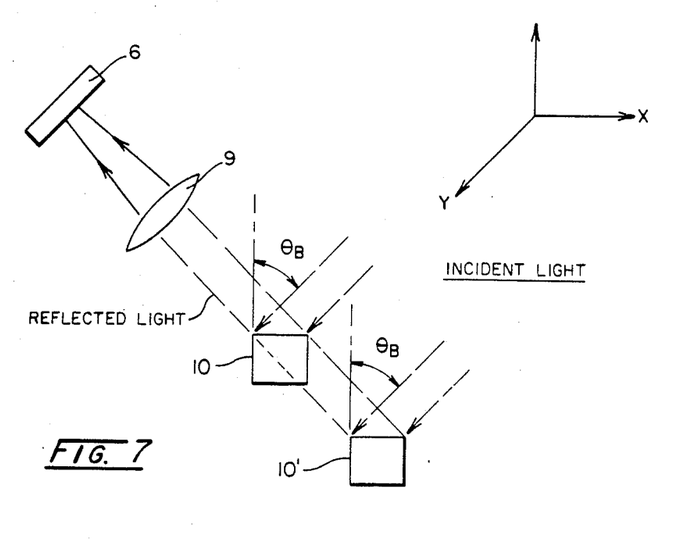
FIG. 7 is a diagrammatic illustration showing that the location of a metal electrode can be precisely detected according to the present invention even when the height and the position (x, y locations) of a semiconductor chip vary.

As illustrated in FIG. 7, two chips 10 and 10', located at different spatial coordinates, are illuminated with glancing incidence wherein the incident angle is Brewster's angle. The chips although in different x-y locations, at certain elevations y could appear to be in the same x-y location and elevation. The chip 10 is assumed to be located at position $x_1$, $y_1$, $z_1$ and the chip 10' to be located at position $x_2$, $y_1$, $z_2$; i.e., light is shown reflecting from both surfaces forming an image on the detector in precisely the same plate. Precise information relating to typical height variations seen in production is not available, but it is anticipated that correction for this characteristic should be included in a production machine.

In this case, a system using two identical detecting systems positioned orthogonally (along x and y axes) would compensate for normal height variations. Precise location of the chip electrode would be a two-step process with this system, i.e., the true x-axis location would be determined, then the true y-axis location would be determined.

The details of the present invention have been described above with respect to a GaP LED. It should be understood, however, that the semiconductor material for use in the present invention is not limited to GaP, but that is may be a Group III-V compound semiconductor such as GaAs, InP and GaA As, or it may be a Group II-VI compound semiconductor such as CdS and CdTe. The only difference in the use of these semiconductor materials is represented by the difference in the wavelengths of the light rays which transmit through the semiconductor materials. Depending on the material used, the transmitting light could be visible light or infrared rays. Brewster's angle also could vary depending on the semiconductor material which is used. However, when different semiconductor materials are used, different filters 17 should be used to enhance the contrast, as described above with reference to FIGS. 3A, 3B, and 3C.

It is herein understood that although the present invention has been specifically disclosed with a preferred embodiment since examples, modifications, and variations of the concepts herein disclosed may be resorted to by those skilled in the art. Such modifications and variations are considered to be within the scope of the invention and the appended claims.

I claim:

1. A system for bonding a lead wire on a metal electrode which is provided on a surface of an essentially transparent semiconductor material chip fixedly mounted on a support means, by precisely locating and imaging the metal electrode relative to the surface of the chip, comprising:
   a. a wire bonding means constructed to hold and manuever a lead wire into bonding contact with the metal electrode by a servomechanism translating the lead wire in orthogonal directions;
   b. a light source means provided externally to said semiconductor chip for illuminating a surface of said semiconductor chip by means of a beam of light rays cast upon the surface of the chip at an oblique angle corresponding substantially to Brewster's angle with respect to the refractive index of the semiconductor material, relative to a line normal to the surface of the semiconductor chip;
   c. detecting means operatively coupled to the wirebonding means and positioned to sense the beam of light rays reflected from the metal electrode and from the surface of the semiconductor chip as the surface is illuminated by the light source means, and to transmit a digitized electronic signal to the wirebonding means and the servomechanisms thereof;
   d. polarizing means provided externally to the semiconductor chip for further polarizing the beam of light rays before it arrives at said detecting means, the axis of polarization of the polarizing means being adjustable to provide maximum image resolution and identification of the position of the metal electrode, and the polarization being adjustable to provide sufficient resolution, to clearly identify the site of location, the size, and the shape of the metal electrode, so that the detecting means detects the image and generates the digitized electronic input signal to operate and manipulate the position of the lead wire in the wirebonding means into bonding contact with the metal electrode; and
   e. support means provided with a parabolic reflecting inner surface and having the transparent semiconductor material chip fixedly mounted thereon.

2. A system for bonding a lead wire on a metal electrode which is provided on a surface of an essentially transparent semiconductor material chip fixedly mounted on a support means, by precisely locating an imaging the metal electrode relative to the surface of the chip, comprising:
   a. a wire bonding means constructed to hold and manuever a lead wire into bonding contact with the metal electrode by a servomechanism translating the lead wire in orthogonal directions;
   b. a light source means provided externally to said semiconductor chip for illuminating a surface of said semiconductor chip by means of a beam of light rays cast upon the surface of the chip at an oblique angle corresponding substantially to Brewster's angle with respect to the refractive index of the semiconductor material, relative to a line normal to the surface of the semiconductor chip;
   c. detecting means operatively coupled to the wirebonding means and positioned to sense the beam of light rays reflected from the metal electrode and from the surface of the semiconductor chip as the surface is illuminated by the light source means, and to transmit a digitized electronic signal to the wirebonding means and the servomechanisms thereof;
   d. polarizing means provided externally to the semiconductor chip for further polarizing the beam of light rays before it arrives at said detecting means, the axis of polarization of the polarizing means being adjustable to provide maximum image resolution and identification of the position of the metal electrode, and the polarization being adjustable to provide sufficient resolution, to clearly identify the site of location, the size, and the shape of the metal electrode, so that the detecting means detects the image and generates the digitized electronic input signal to operate and manipulate the position of the lead wire in the wirebonding means into bonding contact with the metal electrode; and
   e. filter means provided in the path of the illuminating beam of light rays produced by said light source to substantially monochronize the beam of light rays to a wave length corresponding to the maximum light-transmitting coefficient of the semiconductor chip.

3. A system for bonding a lead wire on a metal electrode which is provided on a surface of an essentially transparent semiconductor material chip fixedly mounted on a support means, by precisely locating and imaging the metal electrode relative to the surface of the chip, comprising:
   a. a wire bonding means constructed to hold and manuever a lead wire into bonding contact with the metal electrode by a servomechanism translating the lead wire in orthogonal directions;
   b. a plurality of light source means provided externally to said semiconductor chip for illuminating a surface of said semiconductor chip by means of a beam of light rays cast upon the surface of the chip at an oblique angle corresponding substantially to Brewster's angle with respect to the refractive index of the semiconductor material, relative to a line normal to the surface of the semiconductor chip, and with each light source means providing a beam on the surface of the semiconductor chip at sequential time intervals to provide sequential reflected images for detection whereby the position of the metal electrode may be determined in a third orthogonal dimension for the further positioning of the lead wire by the wire bonding means;
   c. detecting means operatively coupled to the wirebonding means and positioned to sense the beam of light rays reflected from the metal electrode and from the surface of the semiconductor chip as the surface is illuminated by the light source means, and to transmit a digitized electronic signal to the wirebonding means and the servomechanisms thereof; and
   d. polarizing means provided externally to the semiconductor chip for further polarizing the beam of light rays before it arrives at said detecting means, the axis of polarization of the polarizing means being adjustable to provide maximum image resolution and identification of the position of the metal electrode, and the polarization being adjustable to provide sufficient resolution, to clearly identify the site of location, the size, and the shape of the metal electrode, so that the detecting means detects the image and generates the digitized electronic input signal to operate and manipulate the position of the lead wire in the wirebonding means into bonding contact with the metal electrode.

4. A system according to claim 2 in which said beam of light rays is red in color.

5. A system according to claim 2 in which said semiconductor chip is made of a semiconductor material selected from the group consisting of Group III–V compound semiconductors, Group I semiconductors and Group II–VI compound semiconductors.

6. A system according to claim 2 in which said polarizing means is provided in the path of the illuminating beam of light emitting from said light source means.

7. A system according to claim 2 in which said polarizing means is provided in the path of the beam of light reflecting from the metal electrode-carrying semiconductor chip surface and impinging onto the detecting means.

8. A system according to claim 2 in which said polarizing means comprises a first polarizing means in the path of the illuminating bean of light rays emitting from the light source means and a second polarizing means in the path of the beam of light rays reflecting from the metal electrode-carrying semiconductor chip surface and impinging onto the detecting means, the adjustment of the polarizing means being provided by rotation of the angle of polarization between the first polarizing means and the second polarizing means.

* * * * *